US012092235B2

(12) United States Patent
Kim et al.

(10) Patent No.: US 12,092,235 B2
(45) Date of Patent: Sep. 17, 2024

(54) VALVE MODULE AND SUBSTRATE PROCESSING DEVICE COMPRISING THE SAME

(71) Applicant: PRESYS.CO., LTD, Gyeonggi-do (KR)

(72) Inventors: Sang Min Kim, Gyeonggi-do (KR); Jae Min Lee, Gyeonggi-do (KR)

(73) Assignee: PRESYS.CO., LTD, Gyeonggi-do (KR)

( * ) Notice: Subject to any disclaimer, the term of this patent is extended or adjusted under 35 U.S.C. 154(b) by 350 days.

(21) Appl. No.: 17/430,726

(22) PCT Filed: Jan. 3, 2020

(86) PCT No.: PCT/KR2020/000122
§ 371 (c)(1),
(2) Date: Aug. 13, 2021

(87) PCT Pub. No.: WO2020/166823
PCT Pub. Date: Aug. 20, 2020

(65) Prior Publication Data
US 2022/0148855 A1    May 12, 2022

(30) Foreign Application Priority Data
Feb. 13, 2019  (KR) .................... 10-2019-0016638

(51) Int. Cl.
*F16K 25/04*   (2006.01)
*C23C 16/44*   (2006.01)
(Continued)

(52) U.S. Cl.
CPC .......... *F16K 25/04* (2013.01); *C23C 16/4405* (2013.01); *C23C 16/4412* (2013.01);
(Continued)

(58) Field of Classification Search
CPC ........ F16K 25/04; F16K 51/02; F16K 3/0281; C23C 16/4405; C23C 16/4412;
(Continued)

(56) References Cited

U.S. PATENT DOCUMENTS

| 6,103,069 A * | 8/2000 | Davenport ............ C23C 14/564 |
| | | 204/192.12 |
| 6,347,636 B1 * | 2/2002 | Xia .................... H01L 21/67017 |
| | | 134/1.1 |

(Continued)

FOREIGN PATENT DOCUMENTS

| CN | 106164427 | 11/2016 |
| EP | 0843347 | 5/1998 |

(Continued)

OTHER PUBLICATIONS

"International Search Report (Form PCT/ISA/210) of PCT/KR2020/000122", mailed on Apr. 10, 2020, with English translation thereof, pp. 1-4.

(Continued)

*Primary Examiner* — Atif H Chaudry
(74) *Attorney, Agent, or Firm* — JCIPRNET

(57) ABSTRACT

A valve module provided to a substrate processing device including: a process chamber defining a substrate processing space; and a flow path portion coupled to the process chamber and forming a flow path along which a gas activated by plasma flows, the valve module including: a shut-off plate disposed in the flow path to move forwards or rearwards across the flow path through an open slit formed at one side of the flow path portion in order to open or close the flow path; a first driver driving forward or backward movement of the shut-off plate; a shut-off plate-protecting portion moving into a gap between the shut-off plate and the flow path to prevent the shut-off plate from being damaged by the activated gas when the shut-off plate is moved (Continued)

backwards to open the flow path; and a second driver driving movement of the shut-off plate-protecting portion.

10 Claims, 11 Drawing Sheets

(51) Int. Cl.
    *C23C 16/50*      (2006.01)
    *F16K 3/02*      (2006.01)
    *F16K 51/02*      (2006.01)
    *H01J 37/32*      (2006.01)

(52) U.S. Cl.
    CPC ............ *C23C 16/50* (2013.01); *F16K 3/0281* (2013.01); *F16K 51/02* (2013.01); *H01J 37/32449* (2013.01); *H01J 37/32862* (2013.01); *H01J 2237/335* (2013.01)

(58) Field of Classification Search
    CPC ........... H01J 37/32449; H01J 2237/335; H01J 37/32862; H01L 21/67126
    See application file for complete search history.

(56) References Cited

U.S. PATENT DOCUMENTS

| | | | |
|---|---|---|---|
| 2009/0255324 A1 | 10/2009 | Ishibashi et al. | |
| 2011/0308453 A1* | 12/2011 | Su | C23C 16/481 118/708 |
| 2012/0111427 A1* | 5/2012 | Nozawa | C23C 16/52 137/511 |
| 2016/0319938 A1 | 11/2016 | Lind et al. | |
| 2018/0155836 A1 | 6/2018 | Arai et al. | |

FOREIGN PATENT DOCUMENTS

| | | |
|---|---|---|
| JP | H11236978 | 8/1999 |
| JP | 2007043205 | 2/2007 |
| JP | 2010203585 | 9/2010 |
| JP | 4997361 | 8/2012 |
| KR | 100904025 | 6/2009 |
| KR | 20090070571 | 7/2009 |
| KR | 20120103170 | 9/2012 |
| KR | 20120103170 A * | 9/2012 |
| KR | 101201817 | 11/2012 |
| KR | 20170020323 | 2/2017 |
| KR | 20180071123 | 6/2018 |

OTHER PUBLICATIONS

"Office Action of Korea Counterpart Application", issued on Jun. 4, 2020, with English translation thereof, p. 1-p. 11.

"Office Action of Korea Counterpart Application", issued on Dec. 18, 2020, with English translation thereof, p. 1-p. 6.

"Notice of Reasons for Refusal of Japan Counterpart Application", issued on Nov. 15, 2022, with English translation thereof, p. 1-p. 14.

Office Action of China Counterpart Application, with English translation thereof, issued on Dec. 6, 2023, pp. 1-21.

* cited by examiner

VALVE MODULE AND SUBSTRATE PROCESSING DEVICE COMPRISING THE SAME

CROSS-REFERENCE TO RELATED APPLICATION

This application is a 371 of international application of PCT application serial no. PCT/KR2020/000122, filed on Jan. 3, 2020, which claims the priority benefits of Korea application no. 10-2019-0016638, filed on Feb. 13, 2019. The entirety of each of the above-mentioned patent applications is hereby incorporated by reference herein and made a part of this specification.

TECHNICAL FIELD

The present invention relates to a valve module and a substrate processing device including the same, and more particularly to a valve module disposed in a flow path through which a gas activated by plasm flows and a substrate processing device including the same.

BACKGROUND ART

In a device for substrate processing, such as chemical vapor deposition (CVD), process gases having various compositions are fed to a process chamber to deposit a thin film, such as an insulating film and a conductive film, on a substrate.

As a result, the thin film is deposited on the substrate through chemical reaction within the process chamber. Here, by-products can be attached to an inner wall of the process chamber or to a surface of a susceptor.

As a process is repeated in the process chamber, the by-products are continuously accumulated and sometimes separated from the process chamber to form particles, which float in an interior space of the process chamber. Since such floating particles make it difficult to achieve good substrate processing, it is necessary to remove the by-products by periodically cleaning the process chamber.

A process of cleaning the process chamber may be performed by an in-situ process in which a cleaning gas is fed to the process chamber to decompose the by-products attached to the process chamber through activation of the cleaning gas inside the process chamber or by a remote plasma cleaning process in which the cleaning gas is activated through a remote plasma source separate from the process chamber, followed by feeding the activated cleaning gas to the process chamber to decompose the by-product attached to the process chamber.

In the remote plasma cleaning process, the cleaning gas activated by remote plasma is fed to the process chamber through a conduit to which a valve is provided to block or allow flow of the cleaning gas in the conduit.

However, when the valve opens the conduit, a component of the valve (for example, an O-ring for close contact with a shut-off plate) can be damaged by the activated cleaning gas flowing along the conduit to cause leakage of the cleaning gas due to deterioration in sealing of the shut-off plate, thereby providing a problem of frequent replacement of the damaged component for preventing leakage of the cleaning gas.

As a result, there can be problems of difficulty in good substrate processing, increase in operating costs of the substrate processing device, and deterioration in productivity of the substrate processing device.

Since such problems can occur not only in a valve provided to the remote plasma source but also in a valve disposed between the process chamber and a discharge pump, there is a need for a valve structure that can solve such problems.

SUMMARY

Technical Problem

It is an object of the present invention to provide a valve module that can prevent a valve provided to a flow path, along which a gas activated by plasma flows, from being damaged by the activated gas, and a substrate processing device including the same.

In particular, the present invention is aimed at providing a valve module that can prevent leakage of an activated gas due to damage of a sealing member (O-ring), which is provided to a shut-off plate adapted to open or close a flow path, by the activated gas, and a substrate processing device including the same.

Technical Solution

In accordance with one aspect of the present invention, there is provided a valve module (400) provided to a substrate processing device including: a process chamber (100) defining a substrate processing space; and a flow path portion (300) coupled to the process chamber (100) and forming a flow path (302) along which a gas activated by plasma flows, the valve module (400) including: a shut-off plate (410) disposed in the flow path (302) to move forwards or rearwards across the flow path (302) through an open slit (301) formed at one side of the flow path portion (300) in order to open or close the flow path (302); a first driver (420) driving forward or backward movement of the shut-off plate (410); a shut-off plate-protecting portion (430) moving into a gap between the shut-off plate (410) and the flow path (302) to prevent the shut-off plate (410) from being damaged by the activated gas when the shut-off plate (410) is moved backwards to open the flow path (302); and a second driver (440) driving movement of the shut-off plate-protecting portion (430).

The flow path portion (300) may be provided with a valve gate (303) brought into close contact with the shut-off plate (410) upon forward movement of the shut-off plate (410).

The shut-off plate (410) may include a sealing member (413) closely contacting the valve gate (303) to guarantee sealing of the valve gate (303).

The shut-off plate-protecting portion (430) may include a blocking blade (432) moving into a gap between the shut-off plate (410) and the open slit (301) to block the open slit (301) upon backward movement of the shut-off plate (410).

The blocking blade (432) may have a hollow ring shape surrounding a circumference of the flow path (302).

A gap may be formed between the blocking blade (432) and the open slit (301).

The valve module (400) may further include a valve housing (450) in which the shut-off plate (410) and the first driver (420) are disposed.

The valve module (400) may further include an inert gas feeder feeding an inert gas through the valve housing (450) to prevent the activated gas from entering a space in which the shut-off plate (410) is disposed when the shut-off plate (410) is moved backwards to open the flow path (302).

The blocking blade (432) may be moved in a first direction perpendicular to a plate surface of the shut-off plate (410) in association with forward or backward movement of the shut-off plate (410) so as to prevent interference with the shut-off plate (410).

The flow path portion (300) may be disposed between the process chamber (100) and a remote plasma generator (200) generating remote plasma.

A cleaning gas activated in the remote plasma generator (200) may be fed to the process chamber (100) through the flow path portion (300) to clean the process chamber (100).

The flow path portion (300) may be disposed between the process chamber (100) and an exhaust pump (800) for gas emission from the process chamber (100).

In accordance with another aspect of the present invention, there is provided a substrate processing device including: a process chamber (100) defining a substrate processing space; a flow path portion (300) coupled to the process chamber (100) and forming a flow path (302) along which a gas activated by plasma flows; and the valve module (400) according to claim 9 disposed in the flow path portion (300).

The substrate processing device may further include: a cleaning gas feeding line (210) along which the cleaning gas activated in the remote plasma generator (200) is fed to the remote plasma generator (200) to clean the process chamber (100).

The substrate processing device may further include a cooling unit (900) cooling at least one of the flow path portion (300) and the valve module (400).

Advantageous Effects

According to the present invention, the valve module and the substrate processing device including the same can prevent a valve provided to a flow path, along which a gas activated by plasma flows, from being damaged by the activated gas.

In particular, the valve module according to the present invention and the substrate processing device including the same can prevent leakage of the activated gas due to damage of a sealing member (O-ring), which is provided to the shut-off plate adapted to open or close a flow path, by the activated gas.

More specifically, in the valve module and the substrate processing device including the same, the shut-off plate-protecting portion moves into a gap between the shut-off plate and the flow path to prevent the shut-off plate from being directly exposed to an activated gas flowing along the flow path when the shut-off plate opens the flow path, thereby effectively preventing damage to the sealing member provided to the shut-off plate.

DESCRIPTION OF THE EMBODIMENTS

Figure 1:
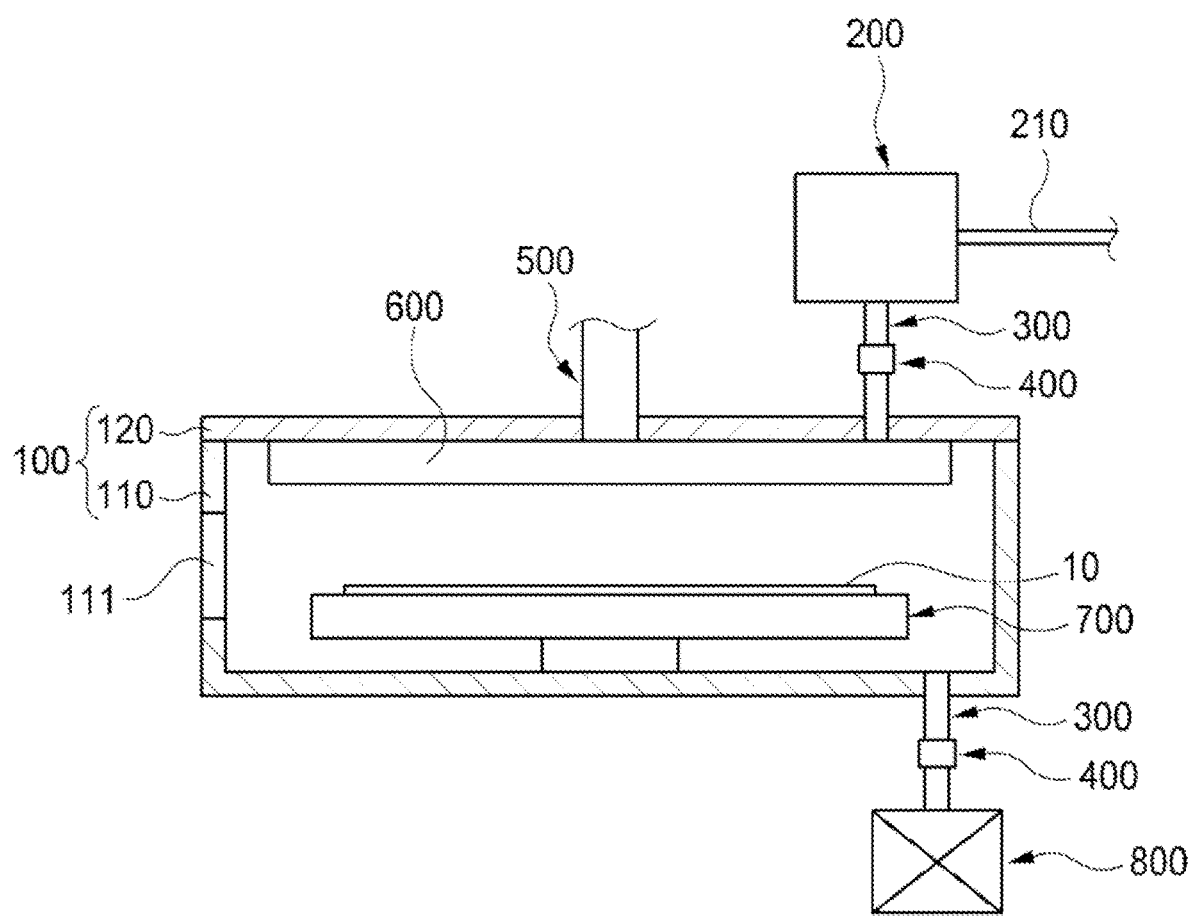
FIG. 1 is a sectional view of a substrate processing device according to one embodiment of the present invention.
Figure 2:
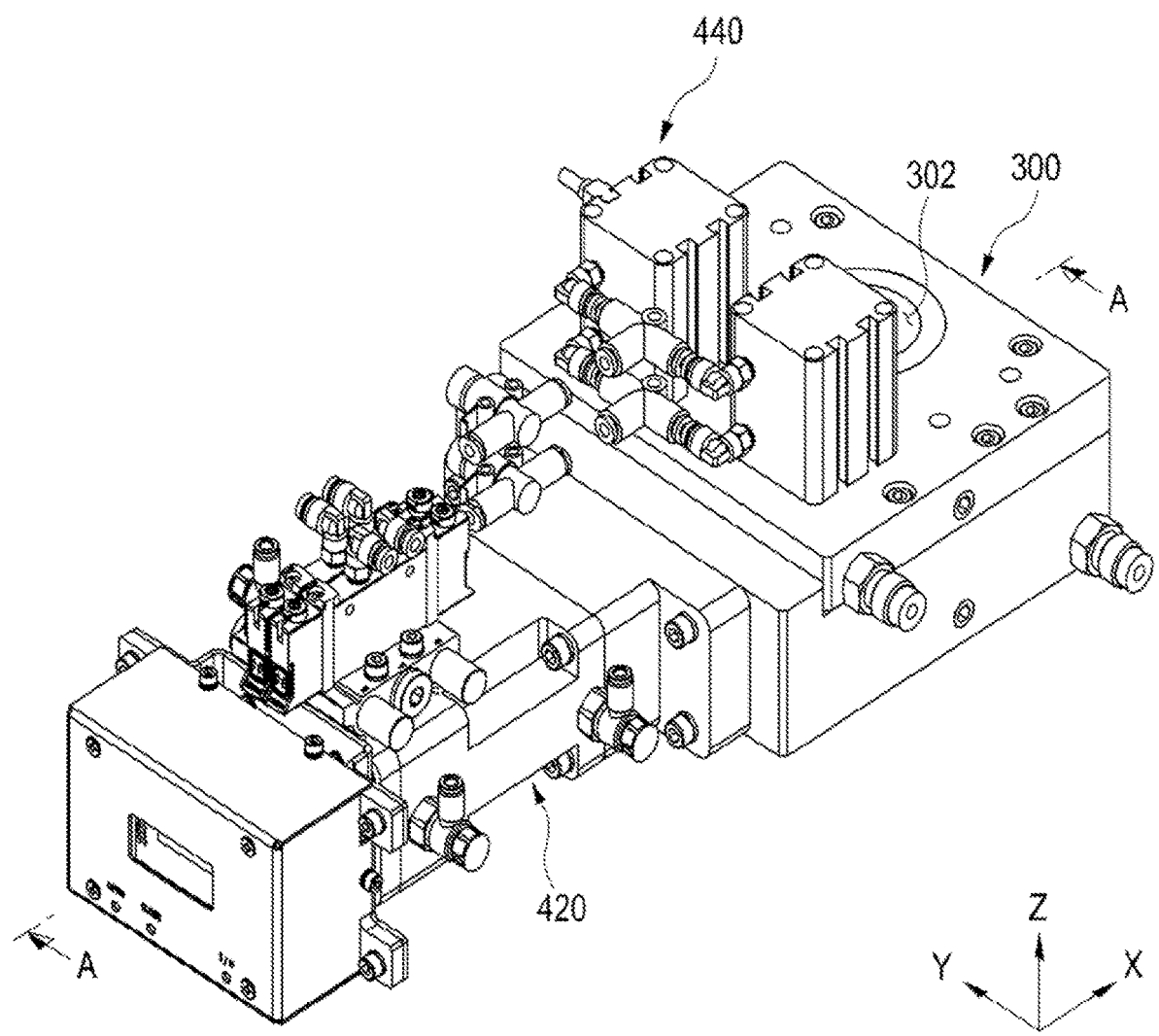
FIG. 2 is a perspective view of a valve module of the substrate processing device shown in FIG. 1.
Figure 3:
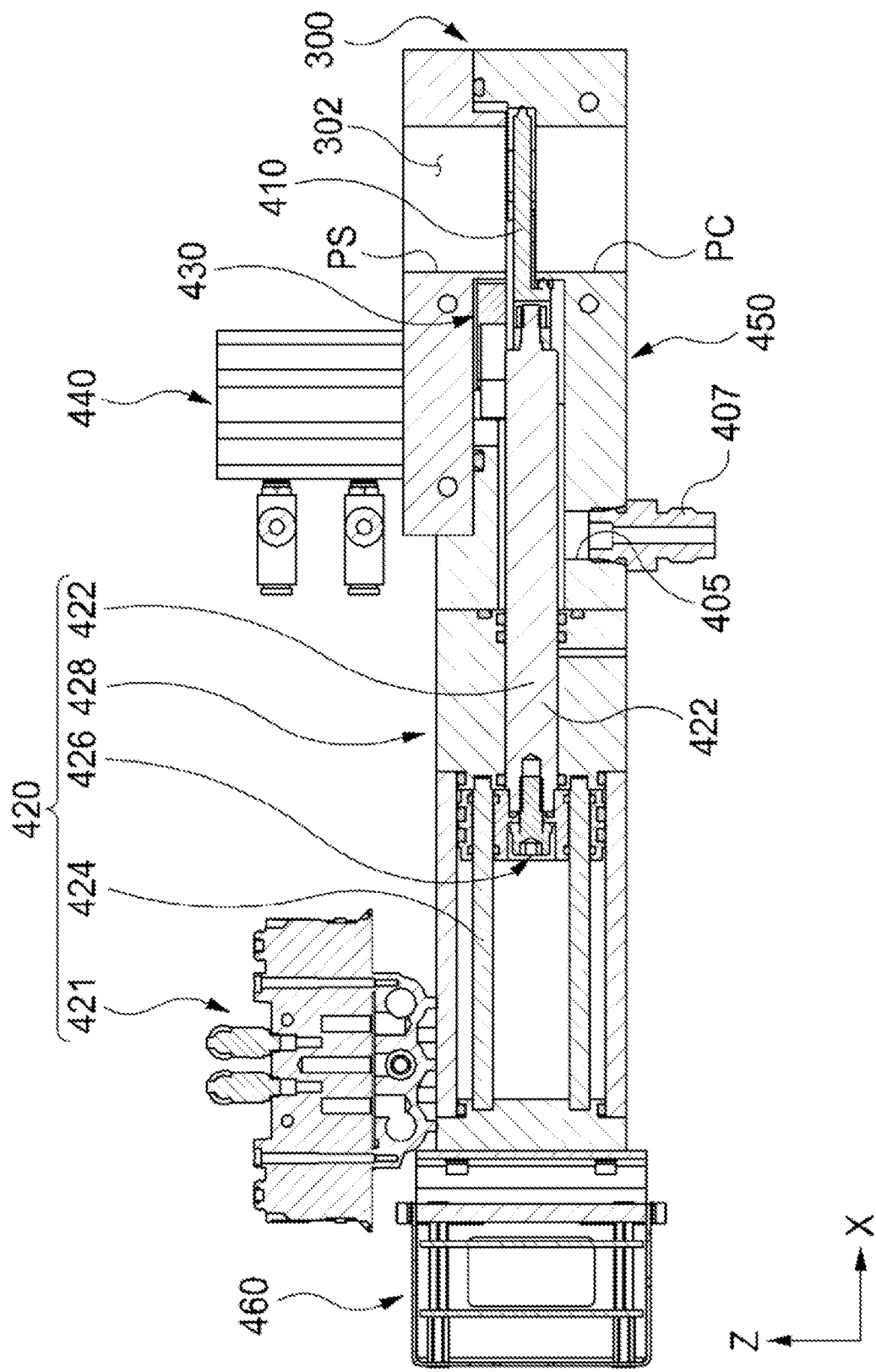
FIG. 3 is a cross-sectional view of the valve module taken along line A-A in FIG. 2.

Hereinafter, embodiments of the present invention will be described in detail with reference to the accompanying drawings.

Referring to FIG. 1 to FIG. 8, a substrate processing device according to the present invention includes: a process chamber 100 defining a substrate processing space; a flow path portion 300 coupled to the process chamber 100 and forming a flow path 302 along which a gas activated by plasma flows; and a valve module 400 disposed in the flow path portion 300.

The process chamber 100 may have various configurations to define a closed substrate processing space therein. For example, the process chamber 100 may include a chamber body 110 having an opening at an upper side thereof and an upper lid 120 detachably coupled to the opening of the chamber body 110 to define the substrate processing space together with the chamber body 110.

The process chamber 100 is formed with at least one gate 111 through which the substrate 10 is introduced into or removed from the process chamber 100.

The process chamber 100 may be connected to or provided with a power application system for substrate processing and an exhaust system for pressure control and emission of the substrate processing space.

In addition, the process chamber 100 may be provided with a gas ejector 600 to eject a process gas into the substrate processing space.

The gas ejector 600 may have various configurations to eject various process gases into the substrate processing space.

For example, the gas ejector 600 may include at least one diffusion plate provided to the upper lid 120 and diffusing a process gas fed through the gas feeding line 500 and a plurality of ejection holes through which the diffused process gas is ejected towards the substrate processing space.

The process chamber 100 may be provided with a substrate support 700 that supports a substrate 10 introduced into the substrate processing space.

The substrate support 700 is disposed in the process chamber 100 and may have various configurations to support the substrate 10. For example, as shown in FIG. 1, the substrate support 700 may include a substrate support plate that supports the substrate 10 on an upper surface thereof, and a substrate support shaft coupled to the substrate support plate and to a vertical substrate driving unit (not shown) through a wall of the process chamber 100 to move in a vertical direction.

The substrate support plate may have a shape corresponding to a planar shape of the substrate 10 and may be provided therein with a heater (not shown) for heating the substrate.

The substrate support shaft is coupled to a lower surface of the substrate support plate and may have various configurations to be coupled to the vertical substrate driving unit (not shown) through the wall of the process chamber 100 to move in the vertical direction.

The vertical substrate driving unit (not shown) may have various configurations to move the substrate support shaft in the vertical direction and may include a motor, a linear guide, a screw, a nut, and the like depending upon the configuration of the device.

The flow path portion 300 is coupled to the process chamber 100 and may have various configurations to form the flow path 302 along which a gas activated by plasma flows.

In one embodiment, the flow path portion 300 may be disposed between the process chamber 100 and a remote plasma generator 200 generating plasma, as shown in FIG. 1.

The remote plasma generator 200 is a remote plasma source generating remote plasma and may have various configurations.

As shown in FIG. 1, the remote plasma generator 200 is disposed remote from the process chamber 100 and may include a remote plasma chamber in which plasma discharge is generated.

The remote plasma chamber may be formed of an anodized aluminum alloy and may be connected to the process chamber 100 through the flow path portion 300 described below.

The remote plasma generator 200 may have the same shape as or a similar shape to a typical remote plasma generator (RPG) and detailed description thereof will be omitted.

The substrate processing device may further include a cleaning gas feeding line 210 along which a cleaning gas for cleaning the process chamber 100 is fed to the remote plasma generator 200.

The cleaning gas introduced into the remote plasma generator 200 through the cleaning gas feeding line 210 may be activated (generate radical ions) by plasma.

The activated cleaning gas may be introduced into the process chamber 100 through the flow path portion 300 described below to clean the interior of the process chamber 100.

The cleaning gas may include a fluorine-containing gas, such as nitrogen fluoride, fluorocarbon, chlorine fluoride, a mixed gas of nitrogen fluoride or fluorocarbon, and a mixed gas of these gases and oxygen, nitrogen or an inert gas.

For example, the cleaning gas may be a mixed gas of $NF_3$, $ClF_3$, $CF_4$, $C_2F_6$, or $C_3F_8$ and oxygen, a mixed gas of $NF_3$ and nitrogen, or a mixed gas of $NF_3$ and a dilution gas.

The dilution gas may include at least one selected from among helium, argon, neon, xenon, and krypton.

In this case, an activated gas (activation species) activated in the remote plasma generator 200 may flow along the flow path portion 300.

When the cleaning gas flows into the remote plasma generator 200, the activated gas (activation species) flowing along the flow path portion 300 may be fluorine radicals activated by remote plasma.

That is, the cleaning gas activated in the remote plasma generator 200 along the flow path portion 300 may be fed to the process chamber 100 to clean the process chamber 100.

Although FIG. 1 illustrates the flow path portion 300 as a component independent of the gas feeding line 500 along which the process gas is fed to the process chamber 100, it should be understood that the present invention is not limited thereto.

That is, the flow path portion 300 may be directly connected to the gas ejector 600 of the process chamber 100 independently of the gas feeding line 500 or may be indirectly connected to the gas ejector 600 through the gas feeding line 500.

In another embodiment, as shown in FIG. 1, the flow path portion 300 may be disposed between the process chamber 100 and the exhaust pump 800 for gas emission from the process chamber 100.

In this embodiment, by-products or the activated gas (activation species) activated in the process chamber 100 can flow through the flow path portion 300.

The valve module 400 may be disposed in the flow path portion 300 and may have various configurations to control flow of the activated gas (activation species) or the by-products flowing along the flow path 302.

For example, in order to open or close the flow path 302 of the flow path portion 300, the valve module 400 may include a shut-off plate 410 disposed to move forwards or backwards across the flow path 302 through the open slit 301 formed at one side of flow path portion 300, and a first driver 420 driving forward or backward movement of the shut-off plate 410.

Figure 5A:
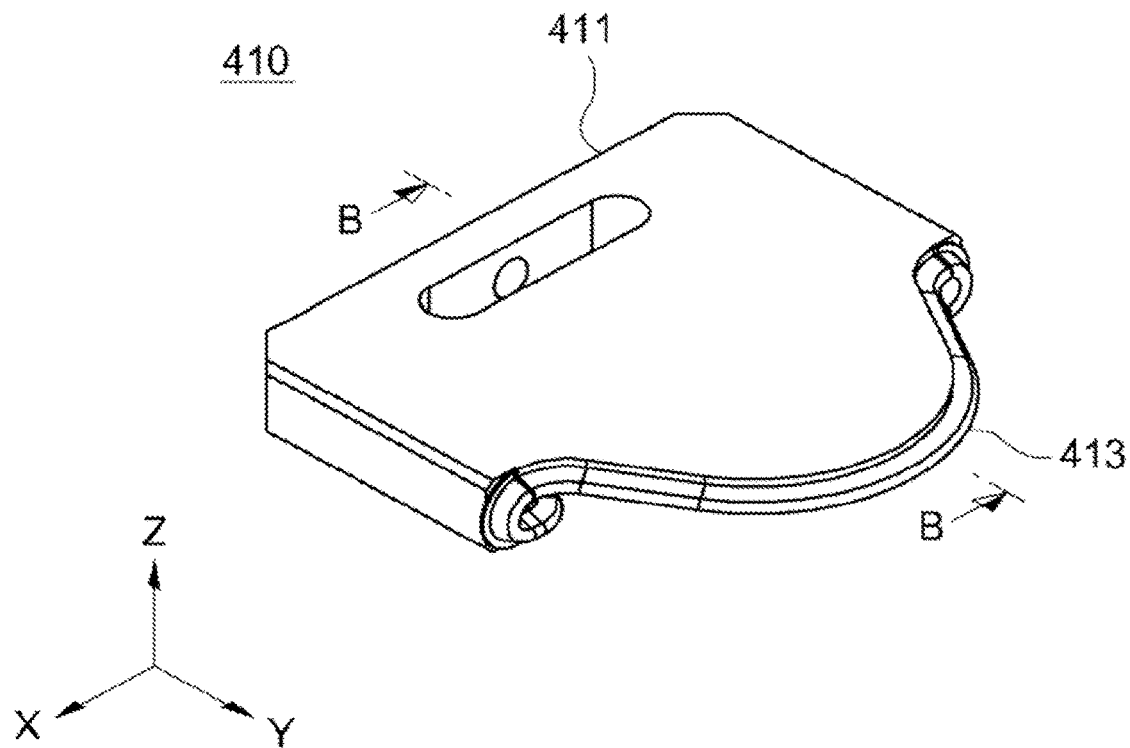
FIG. 5A to FIG. 5C are a perspective view of a portion of the valve module shown in FIG. 2, a bottom view thereof and a cross-sectional view taken along line B-B.
Figure 5B:
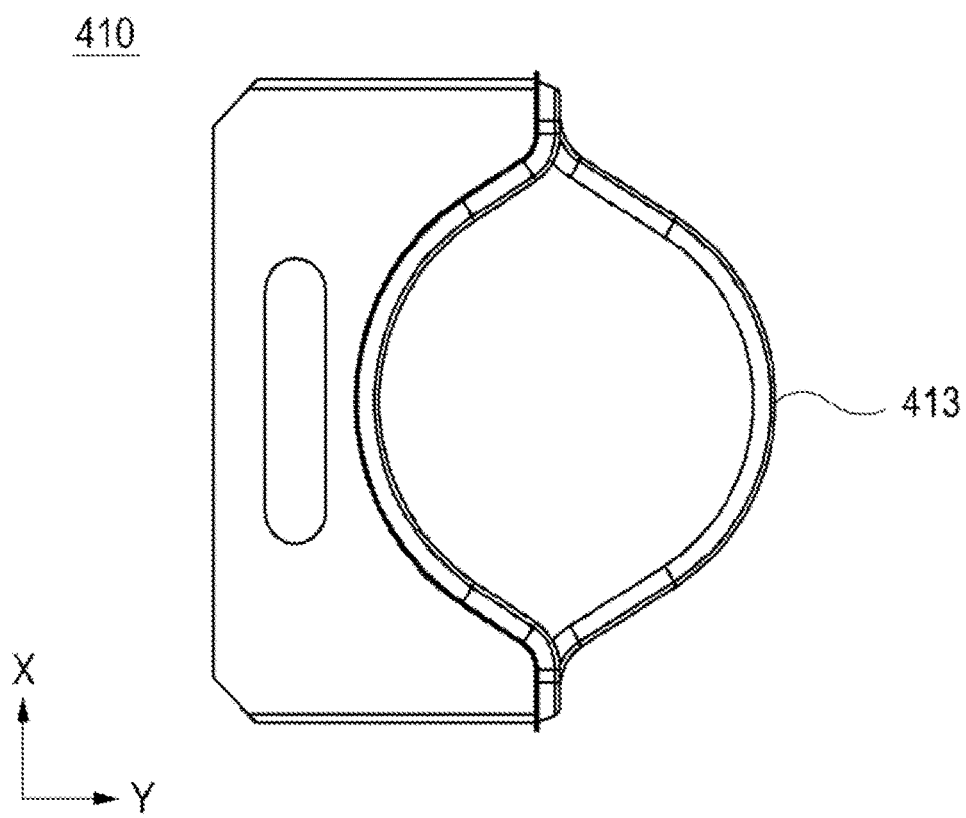
Figure 5C:
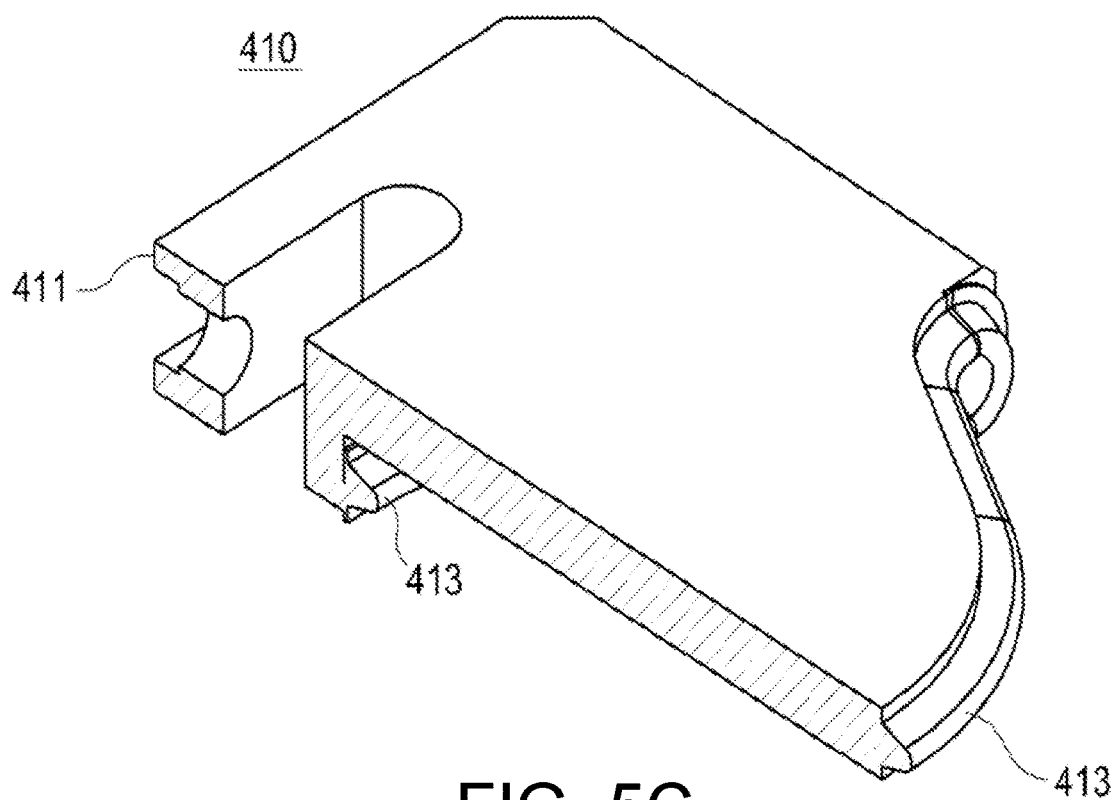

The shut-off plate 410 moves forwards or backwards across the flow path 302 and may be formed of various materials in various shapes in order to open or close the flow path 302. For example, as shown in FIG. 5A to FIG. 5C, the shut-off plate 410 may be a plate that has a step formed at one side thereof so as to closely contact a circumference of the flow path 302.

The flow path portion 300 may be formed with the open slit 301 through which the shut-off plate 410 moves forwards or backwards across the flow path 302.

The open slit 301 is an opening which allows the shut-off plate 410 to move towards the flow path 302 of the shut-off plate 410 in a forward or backward direction and may have various shapes and sizes. Preferably, the open slit 301 is formed to a predetermined width along the circumference of the flow path 302 and has a length to allow at least the shut-off plate 410 to pass therethrough without friction.

Here, the open slit 301 may form a boundary between a flow path PS at the remote plasma generator 200 side (or at the exhaust pump 800 side) and a flow path PC at the process chamber 100 side.

In addition, the flow path portion 300 may be formed with a valve gate 303 closely covered by the shut-off plate 410 at the remote plasma generator 200 (or at the exhaust pump 800 side) or at the process chamber 100 side with reference to the open slit 301.

The valve gate 303 may be brought into close contact with the shut-off plate 410 upon forward movement of the shut-off plate 410 (upon closing the flow path 302). Although the valve gate 303 is formed at the process chamber 100 side in the embodiment shown in FIG. 1 to FIG. 8, it should be understood that the present invention is not limited thereto.

The shut-off plate 410 may include a sealing member 413 which closely contacts the valve gate 303 to guarantee sealing.

The sealing member 413 may have various configurations to seal the valve gate 303 through close contact with the valve gate 303. For example, the sealing member 413 may be realized by an O-ring member or a protrusion formed in a close contact region.

Although the sealing member 413 is illustrated as a protrusion integrally formed with the shut-off plate 410 along a region of the shut-off plate 410 closely contacting the valve gate 303 in the embodiment shown in FIG. 2 to FIG. 8, a separate O-ring member may be disposed along the close contact region of the shut-off plate 410 in other embodiments.

In addition, since the shut-off plate 410 moves forwards or backwards across the flow path 302, the shut-off plate 410 has a stepped structure at one side thereof such that the sealing member 413 protrudes towards the flow path 302 in order to facilitate sealing of the valve gate 303 with the sealing member 413. This structure can minimize damage to a sealing member 413 by minimizing force applied from the first driver 420 described below to compress the shut-off plate 410 in the forward direction (X-axis direction in the drawings) and can maximize the sealing effect of the valve gate 303 by the shut-off plate 410 by compressing the shut-off plate 410 in the forward direction.

Since the shut-off plate 410, particularly the sealing member 413, can be damage by the activated gas flowing along the flow path 302, it is desirable that the shut-off plate 410, particularly the sealing member 413, be formed of a material having good durability with respect to the activated gas. In addition, since the shut-off plate 410, particularly the sealing member 413, is exposed to a high temperature condition by the activated gas and can be adhered to the valve gate 303, the shut-off plate 410, particularly the sealing member 413, is preferably formed of a material exhibiting low adhesion at high temperature.

The first driver 420 is a drive source for driving forward or backward movement of the shut-off plate 410 and may be realized by various driving methods, for example, a solenoid valve.

For example, the first driver 420 may include a moving block 426 coupled to a main rod 422 that is coupled to one end of the shut-off plate 410, a guide rod 424 extending in a movement direction of the moving block 426 and guiding movement of the moving block 426 movably coupled to the guide rod 424, and a moving block driver 421 driving movement of the moving block 426.

The main rod 422 may be coupled to the shut-off plate 410 through a coupling portion 411 formed at one end of the shut-off plate 410.

The first driver 420 may further include a driver frame 428 on which the shut-off plate 410 and first driver 420 are disposed. The driver frame 428 may have a hollow cylindrical structure along which the moving block 426 is moved.

The moving block driver 421 may be a solenoid module that controls air pressure in the driver frame 428 for movement of the moving block 426.

The valve module 400 may further include a valve housing 450 in which the shut-off plate 410 and the first driver 420 are disposed.

The valve housing 450 refers to a housing in which the shut-off plate 410 and the first driver 420 are disposed and may be formed of various materials in various shapes. The valve housing 450 may be coupled to the flow path portion 300 to constitute at least part of the flow path 302 or the open slit 301.

Since the valve module 400 opens or closes the flow path 302 in which the activated gas flows, the shut-off plate 410 is likely to be exposed to the activated gas through the open slit 301, through which the shut-off plate 410 passes, when the valve module 400 opens the flow path 302 (in a state that the shut-off plate 410 is moved backwards).

Accordingly, the valve module 400 may include an inert gas feeder that feeds an inert gas through the valve housing 450 in order to prevent the gas (activation species) activated by plasma from entering a space, in which the shut-off plate 410 is placed, when the shut-off plate 410 is moved backwards to open the flow path 302.

Since the inert gas feeder feeds the inert gas to the space in which the shut-off plate 410 is placed, the inert gas can prevent plasma (specifically, activated gas) from spreading towards the shut-off plate 410 through the open slit 301.

Figure 4A:
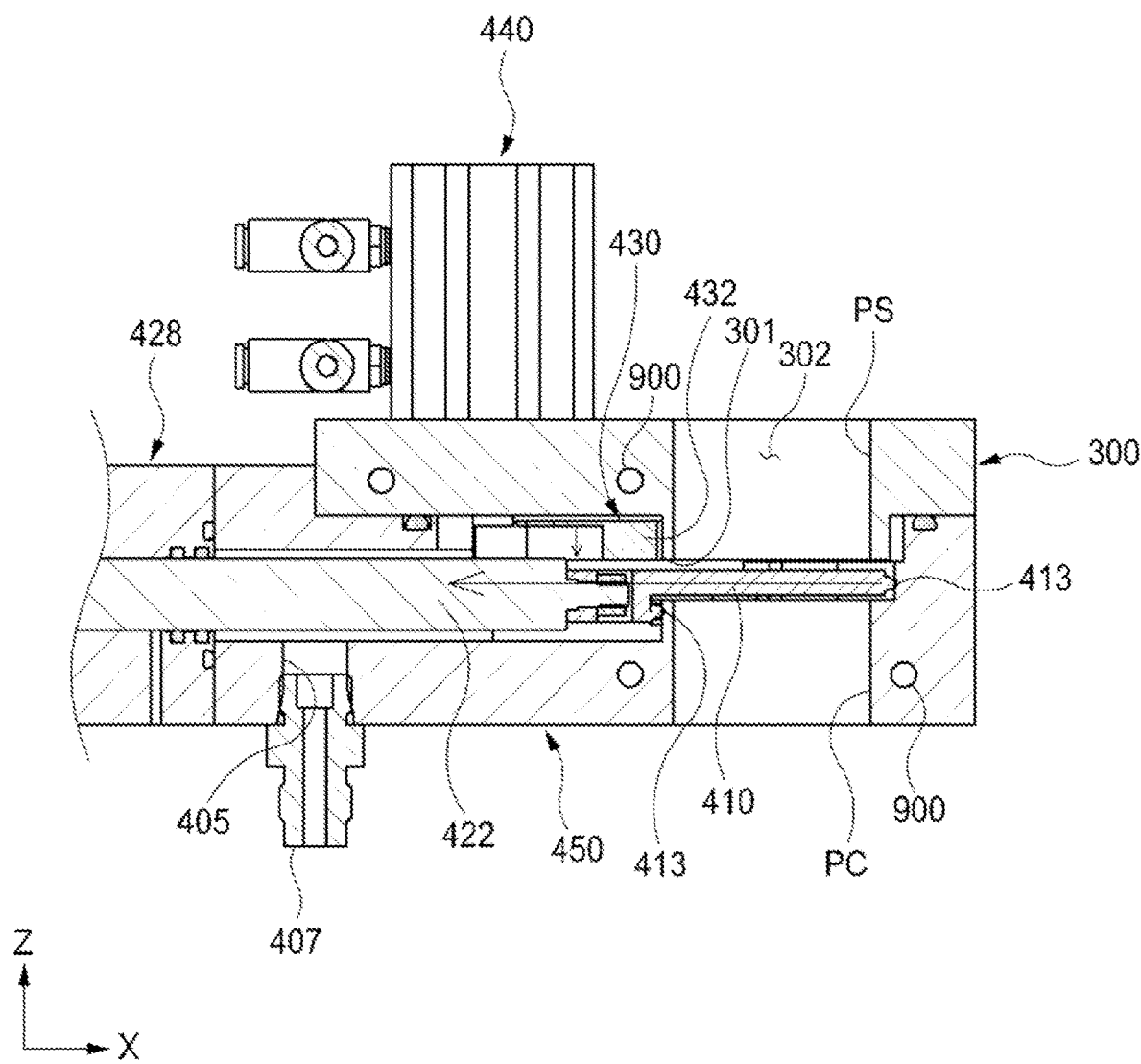
FIG. 4A and FIG. 4B are views of the valve module shown in FIG. 2 in operation of the valve module, showing a state in which the valve module closes a flow path and a state in which the valve module opens the flow path, respectively.
Figure 4B:
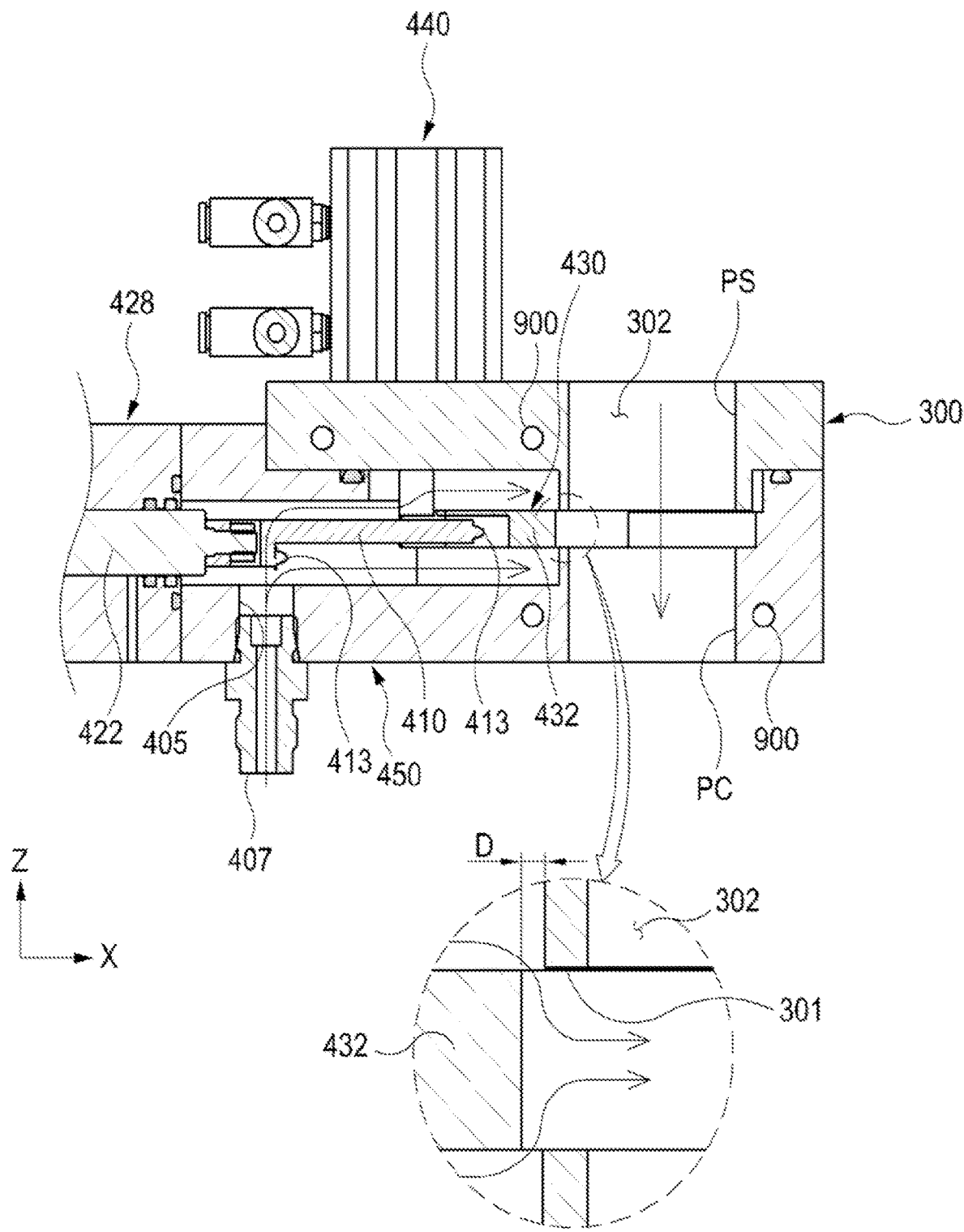
Figure 7A:
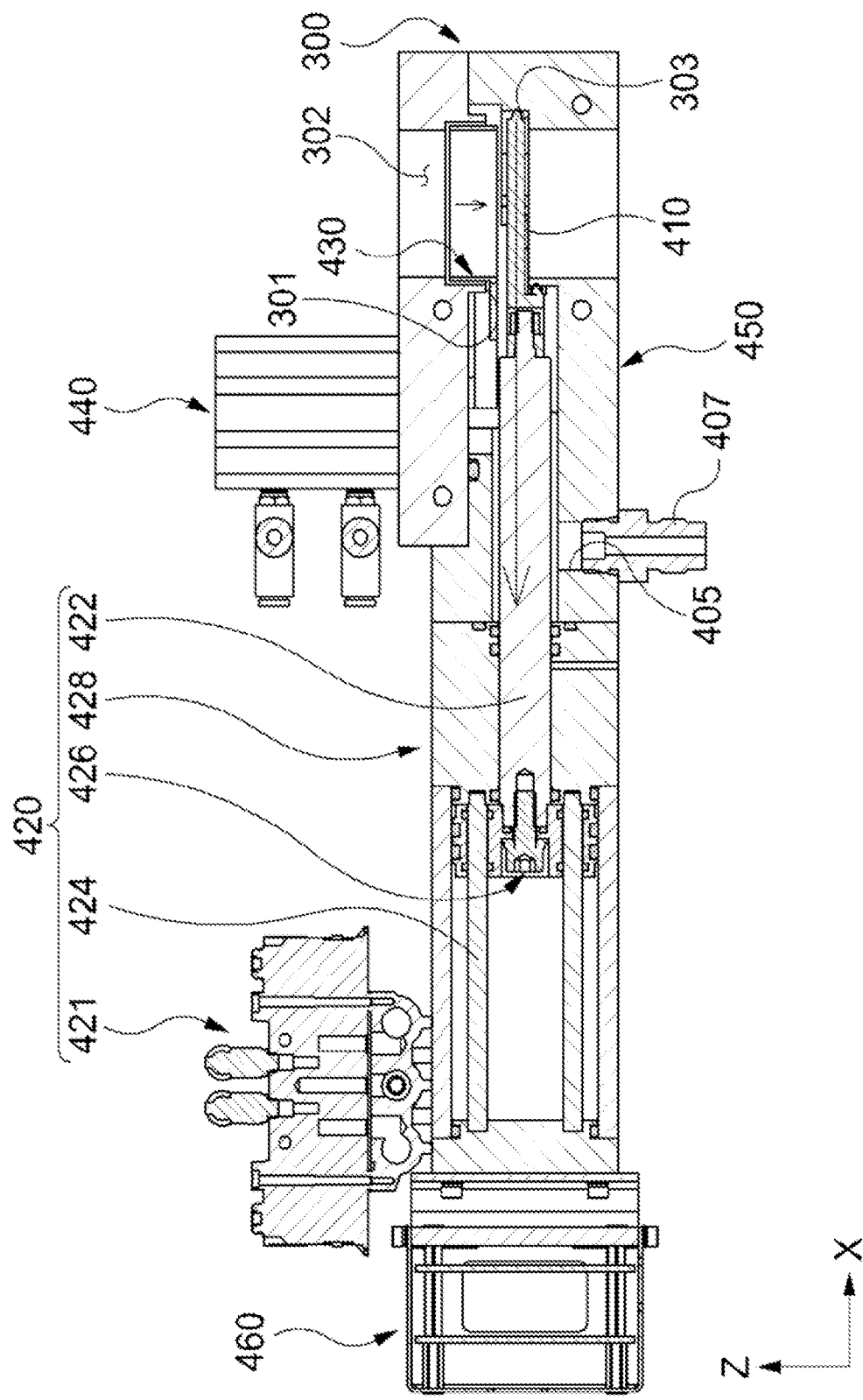
FIG. 7A and FIG. 7B are views of a valve module according to another embodiment of the present invention in operation of the valve module, showing a state in which the valve module closes a flow path and a state in which the valve module opens the flow path, respectively.
Figure 7B:
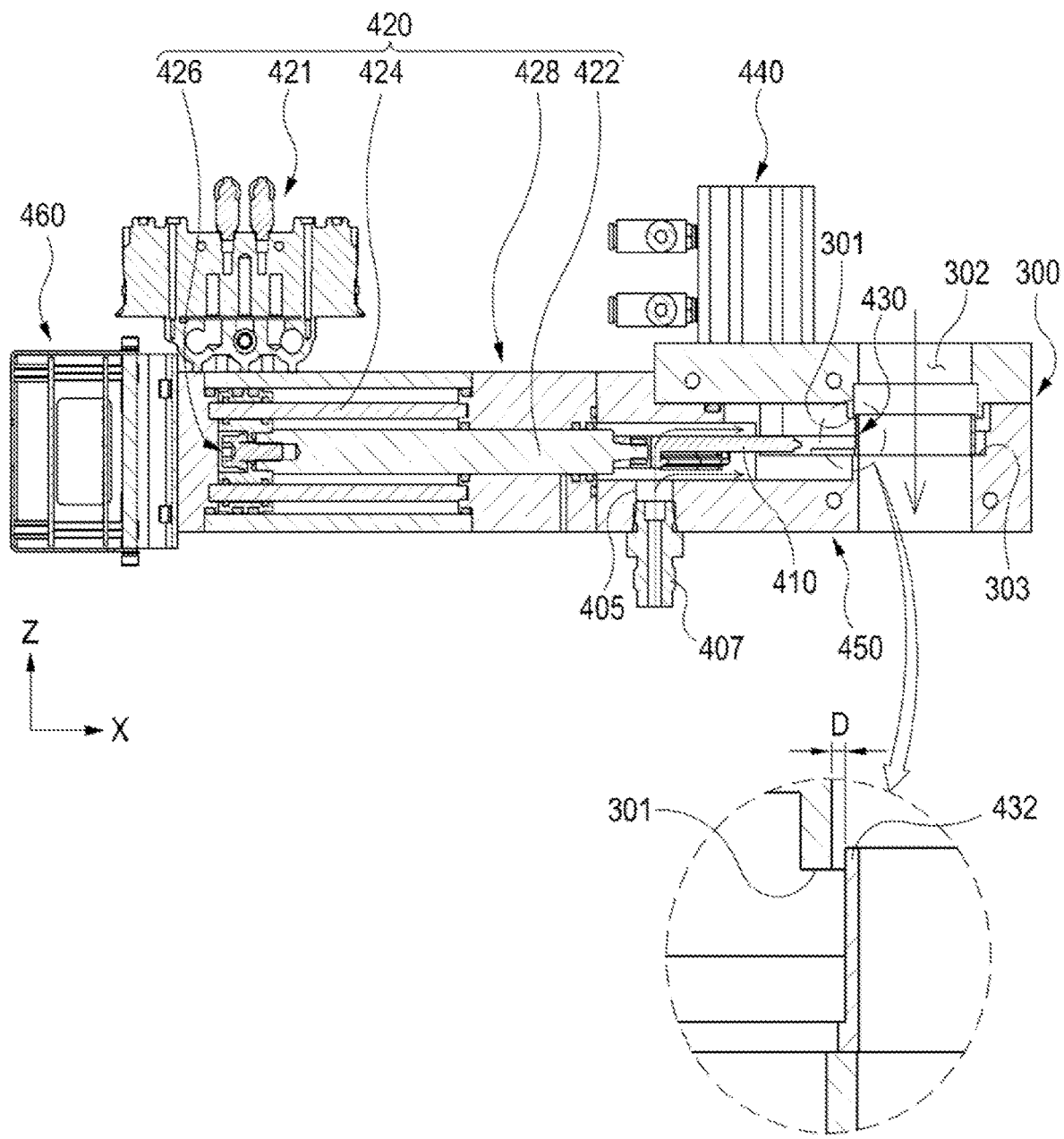

Referring to FIG. 4B and FIG. 7B, the inert gas feeder may be provided to an inert gas feeding line 407, which is connected to an inert gas inlet port 405 formed at one side of the valve housing 450.

When the inert gas is fed to the space in which the shut-off plate 410 is placed, it is possible to prevent plasma from entering the space for the shut-off plate 410 through the open slit 301 to some degree. However, since the shut-off plate 410 is directly exposed to the flow path 302, in which the gas (activation species) activated by plasma flows, through the open slit 301, there can be still a problem of damage to the sealing member 413 of the shut-off plate 410.

Thus, the valve module 400 according to the present invention may have a structure that can prevent the shut-off plate 410, particularly the sealing member 413 of the shut-off plate 410, from being directly exposed to the activated gas.

Specifically, the valve module 400 according to the present invention may further include: a shut-off plate-protecting portion 430 formed to move to a gap between the shut-off plate 410 and the flow path 302 to prevent the shut-off plate 410 from being damaged by the gas (activation species) activated by plasma when the shut-off plate 410 is moved backwards to open the flow path 302; and a second driver 440 driving movement of the shut-off plate-protecting portion 430.

The shut-off plate-protecting portion 430 may be configured to move to the gap between the shut-off plate 410 and the flow path 302 to prevent the shut-off plate 410 from being damaged by plasma when the shut-off plate 410 is moved backwards to open the flow path 302 and may have various shapes and sizes. In addition, like the shut-off plate 410, the shut-off plate-protecting portion 430 may be formed of a material having good durability with respect to the activated gas.

Specifically, the shut-off plate-protecting portion 430 may include a blocking blade 432 that moves into a gap between the shut-off plate 410 and the open slit 301 to block the open slit 301 upon backward movement of the shut-off plate 410.

The blocking blade 432 may have any shape so long as the blocking blade 432 can move into the gap between the shut-off plate 410 and the open slit 301 to block the open slit 301.

Figure 6A:
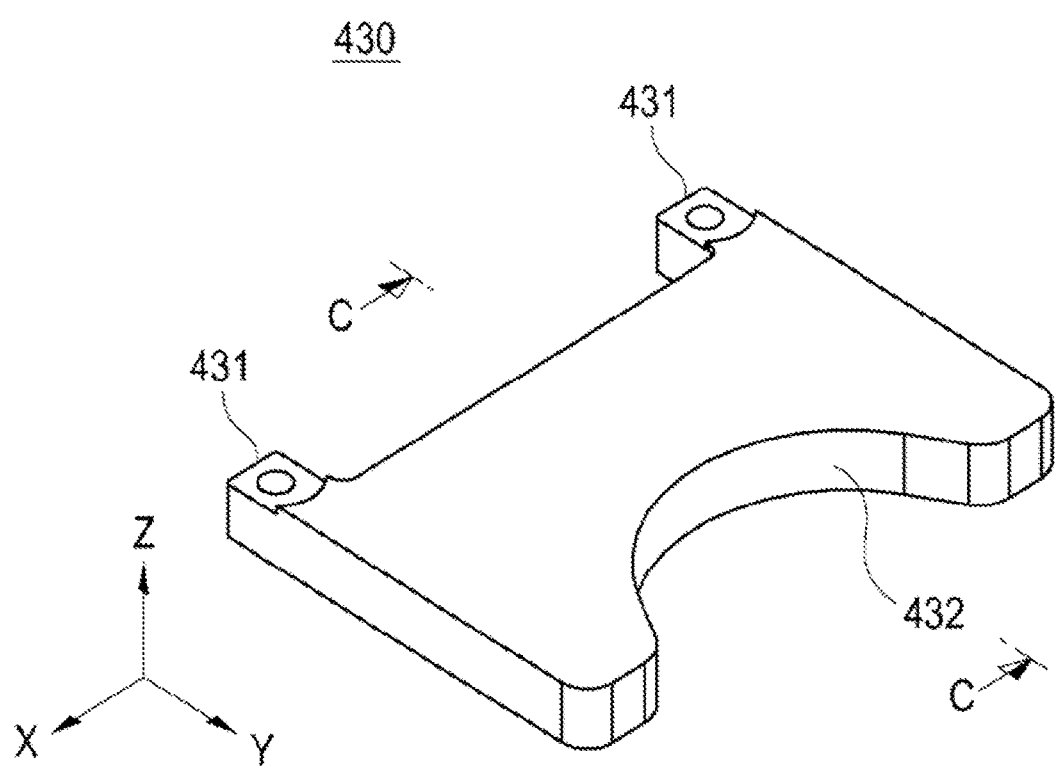
FIG. 6A to FIG. 6C are a perspective view of a portion of the valve module shown in FIG. 2, a bottom view thereof and a cross-sectional view taken along line C-C, respectively.
Figure 6B:
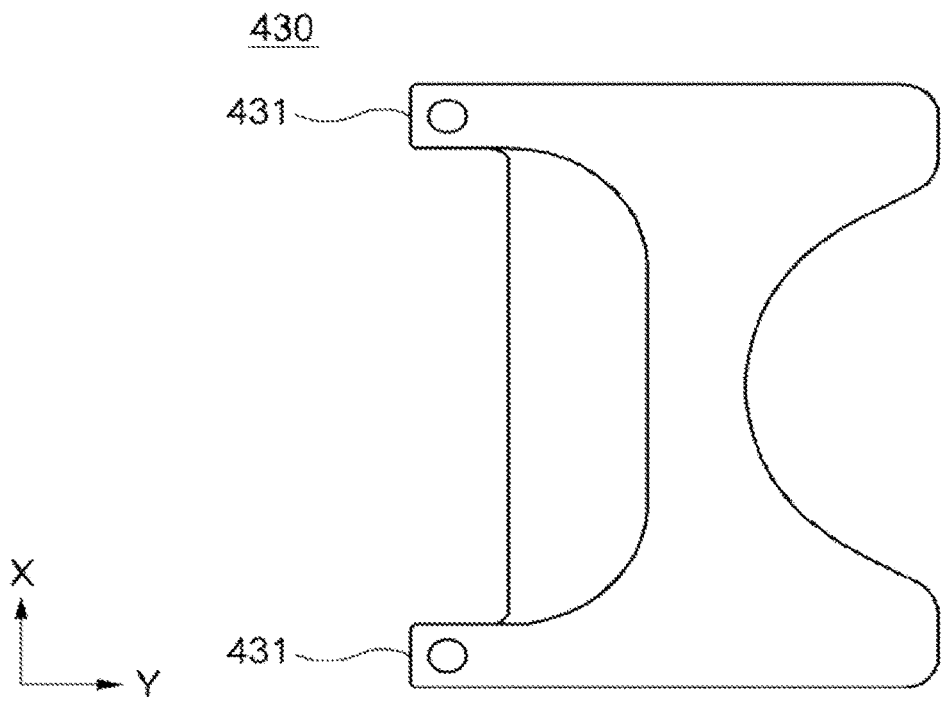
Figure 6C:
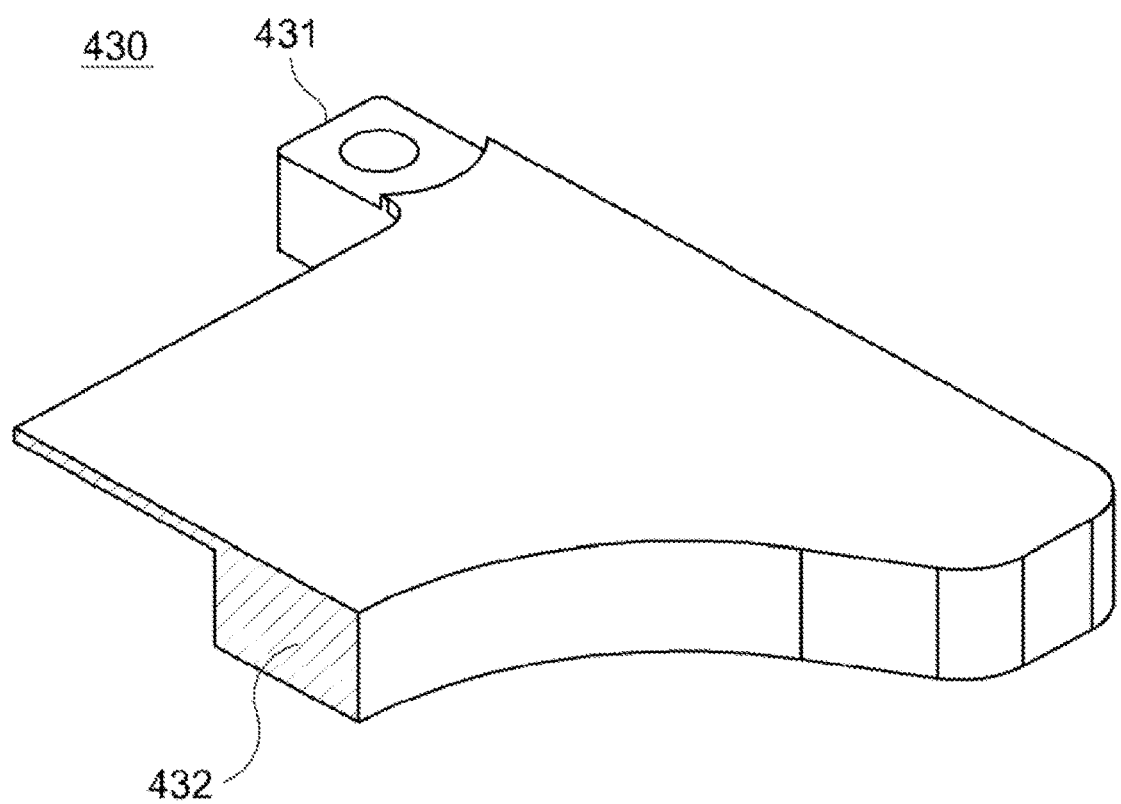

In one embodiment, the blocking blade 432 may have a shape corresponding to the length and width of the open slit 301, as shown in FIG. 6A to FIG. 6C.

Figure 8:
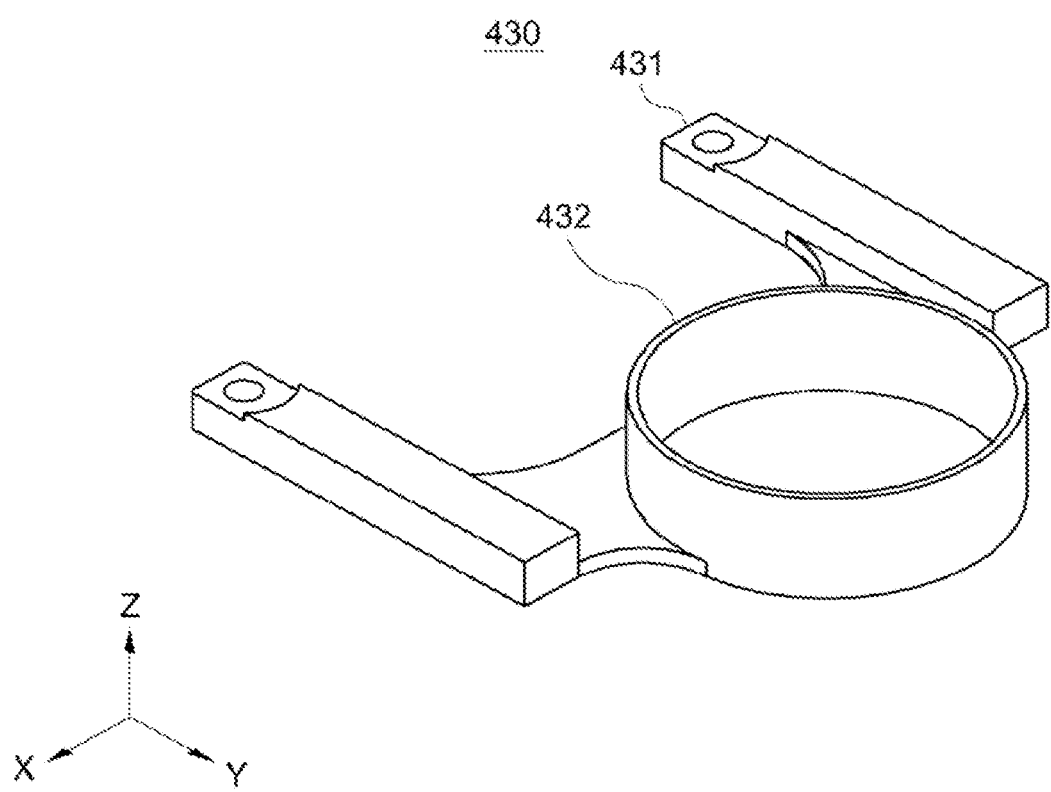
FIG. 8 is a perspective view of a portion of the valve module shown in FIG. 7A and FIG. 7B.

In another embodiment, the blocking blade 432 may have a hollow ring shape surrounding the circumference of the flow path 302, as shown in FIG. 7A to FIG. 8.

In the embodiment shown in FIG. 7A to FIG. 8, the blocking blade 432 may surround the entire circumference of the flow path 302 while blocking the open slit 301.

When the blocking blade 432 is configured to block a region corresponding to the open slit 301 instead of surrounding the entire circumference of the flow path 302, as shown in FIG. 6A to FIG. 6C, it is possible to simplify the configuration of the shut-off plate-protecting portion 430 through omission of an unnecessary portion and to minimize a problem caused by burning of the blocking blade 432 under high temperature conditions.

When the blocking blade 432 moves into the gap between the shut-off plate 410 moved backwards and the open slit 301, a gap D may be generated between the blocking blade 432 and the open slit 301, as shown in FIG. 4B.

As the gap is generated between the blocking blade 432 and the open slit 301, the blocking blade 432 and the open slit 301 can be moved without friction.

As shown in FIG. 4B, the inert gas fed from the inert gas feeder flows to the flow path 302 through the gap D, thereby preventing plasma (activation species) from spreading towards the shut-off plate 410. Here, since the gap D is much smaller than the open slit 301, the inert gas can sufficiently prevent infiltration of plasma to the shut-off plate 410.

Referring to FIG. 4A, FIG. 4B, FIG. 7A and FIG. 7B, the blocking blade 432 may move in a first direction (in the Y-axis direction in the drawings) perpendicular to a plate surface of the shut-off plate 410 (X-Y plane in the drawings) in association with forward or backward movement of the shut-off plate 410 (movement in the X-axis direction in the drawings) so as to prevent interference with the shut-off plate 410.

The second driver 440 drives movement of the shut-off plate-protecting portion 430 and may adopt various driving methods.

The second driver 440 may be coupled to the shut-off plate-protecting portion 430 through a coupling portion 431 formed at a distal end of the shut-off plate-protecting portion 430.

In addition, the valve module 400 may include a valve controller 460 that controls operation of the first driver 420 and the second driver 440 to control opening/closing of the flow path 302.

The substrate processing device according to the present invention may further include a cooling unit 900 that cools at least one of the flow path portion 300 and the valve module 400.

The cooling unit 900 may have various configurations to cool at least one of the flow path portion 300 and the valve module 400. For example, as shown in FIG. 2, FIG. 4A, FIG. 4B, FIG. 7A and FIG. 7B, the cooling unit 900 may include a cooling flow path formed in the flow path portion 300 or in the valve housing 450 to allow a coolant to flow therethrough.

As the cooling unit 900 cools at least one of the flow path portion 300 and the valve module 400, it is possible to prevent damage to the sealing member through adhesion of the sealing member 413 under high temperature conditions.

Next, with reference to FIG. 4A, FIG. 4B, FIG. 7A and FIG. 7B, a process of opening or closing the valve gate 303 in the substrate processing device will be described.

FIG. 4A and FIG. 7A show forward movement of the shut-off plate 410 (in the X-axis direction in the drawings) to close the flow path 302 through the open slit 301.

Here, forward movement of the shut-off plate 410 may mean movement of the shut-off plate 410 in a direction in which the shut-off plate 410 approaches the flow path 302.

As a result, since the flow path 302 is closed by the shut-off plate 410, the activated gas cannot flow along the flow path 302.

The shut-off plate-protecting portion 430 is placed in a space not interfering with the shut-off plate 410. Although FIG. 4A and FIG. 7B show that the shut-off plate-protecting portion 430 is placed in a space at the remote plasma generator 200 side (or at the exhaust pump 800 side) with reference to the shut-off plate 410, it should be understood that the shut-off plate-protecting portion 430 is placed in a space at the process chamber 100 side with reference to the shut-off plate 410.

When there is a need for supply of remote plasma (supply of the activated gas) to the process chamber 100 or a need for emission from the process chamber 100, the shut-off plate 410 may be moved backwards (in the X-axis direction in the drawings) to open the flow path 302.

FIG. 4B and FIG. 7B show backward movement of the shut-off plate 410 (in the X-axis direction in the drawings) to open the flow path 302. Here, the process chamber 100 may be cleaned by an activated cleaning gas fed to the process chamber 100 along the flow path 302.

Here, backward movement of the shut-off plate 410 may mean movement of the shut-off plate 410 in a direction in which the shut-off plate 410 moves away from the flow path 302.

As a result, since the shut-off plate 410 is removed from the flow path 302, the flow path 302 is opened to allow the activated gas to flow along the flow path 302.

In association with backward movement of the shut-off plate 410, the shut-off plate-protecting portion 430 enters the gap between the shut-off plate 410 and the open slit 301 to block the open slit 301.

FIG. 4B and FIG. 7B shows that the shut-off plate-protecting portion 430 is moved from the space at the remote plasma generator 200 side (or at the exhaust pump 800 side) with reference to the shut-off plate 410 to the open slit 301 side to block the open slit 301. Although not shown in the drawings, it should be understood that the shut-off plate-protecting portion 430 may be moved from the space at the process chamber 100 side with reference to the shut-off plate 410 to the open slit 301 at an upper side thereof to block the open slit 301.

When there is a need to block supply of remote plasma (supply of the activated gas) to the process chamber 100 (for example, after cleaning of the process chamber 100 is completed) or a need for emission from the process chamber 100, the shut-off plate-protecting portion 430 returns back to an original location of FIG. 4A or FIG. 7A such that the shut-off plate 410 can be moved forwards towards the flow path 302 to close the flow path 302.

Although some embodiments have been described herein, it should be understood that these embodiments are provided for illustration only and are not to be construed in any way as limiting the present invention. Therefore, the scope of the present invention should be defined by the appended claims and equivalents thereto.

What is claimed is:

1. A valve module provided to a substrate processing device comprising: a process chamber defining a substrate processing space; and a flow path portion coupled to the process chamber and forming a flow path along which a gas activated by plasma flows, the valve module comprising:
a shut-off plate disposed in the flow path to move forwards or rearwards across the flow path through an open slit formed at one side of the flow path portion in order to open or close the flow path;
a first driver driving forward or backward movement of the shut-off plate;
a shut-off plate-protecting portion moving into a gap between the shut-off plate and the flow path to prevent the shut-off plate from being damaged by the activated gas when the shut-off plate is moved backwards to open the flow path; and a second driver driving movement of the shut-off plate-protecting portion in a first direction perpendicular to a plate surface of the shut-off plate, wherein the shut-off plate-protecting portion includes a blocking blade moving into a gap between the shut-off plate and the open slit to block the open slit upon backward movement of the shut-off plate, wherein the shut-off plate-protecting portion further includes two coupling portions coupled to to the second driver, wherein the two coupling portions are respectively extended along the backward movement direction of the shut-off plate at both end portions of the blocking blade, when the blocking blade moves into the gap between the shut-off plate and the open slit to block the open slit, the shut-off plate is located between the two coupling portions.

2. The valve module according to claim 1, wherein the flow path portion is provided with a valve gate brought into close contact with the shut-off plate upon forward movement of the shut-off plate and the shut-off plate comprises a sealing member closely contacting the valve gate to guarantee sealing of the valve gate.

3. The valve module according to claim 1, wherein the blocking blade has a hollow ring shape surrounding a circumference of the flow path.

4. The valve module according to claim 1, wherein a gap is formed between the blocking blade and the open slit.

5. The valve module according to claim 1, further comprising:

a valve housing in which the shut-off plate and the first driver are disposed.

6. The valve module according to claim 5, further comprising:

an inert gas feeder feeding an inert gas through the valve housing to prevent the activated gas from entering a space in which the shut-off plate is disposed when the shut-off plate is moved backwards to open the flow path.

7. The valve module according to claim 1, wherein the blocking blade is moved in the first direction in association with forward or backward movement of the shut-off plate so as to prevent interference with the shut-off plate.

8. The valve module according to claim 1, wherein the flow path portion is disposed between the process chamber and a remote plasma generator generating remote plasma.

9. The valve module according to claim 8, wherein a cleaning gas activated in the remote plasma generator is fed to the process chamber through the flow path portion to clean the process chamber.

10. The valve module according to claim 1, wherein the flow path portion is disposed between the process chamber and an exhaust pump for gas emission from the process chamber.

* * * * *